US012688004B2

(12) United States Patent
Kaplan et al.

(10) Patent No.: US 12,688,004 B2
(45) Date of Patent: Jul. 21, 2026

(54) AUDIO AMPLIFIER WITH INTEGRATED DIGITAL SIGNAL PROCESSING AND SELECTABLE PROFILES

(71) Applicant: SSV WORKS, INC., Oxnard, CA (US)

(72) Inventors: Trevor Kaplan, Thousand Oaks, CA (US); Eleuterio T. Lopez, Jr., Oxnard, CA (US); Jeremy Prater, Oxnard, CA (US)

(73) Assignee: SSV Works, Inc., Camarillo, CA (US)

( * ) Notice: Subject to any disclaimer, the term of this patent is extended or adjusted under 35 U.S.C. 154(b) by 561 days.

(21) Appl. No.: 17/749,010

(22) Filed: May 19, 2022

(65) Prior Publication Data

US 2022/0374195 A1 Nov. 24, 2022

Related U.S. Application Data

(60) Provisional application No. 63/190,654, filed on May 19, 2021.

(51) Int. Cl.
| | |
|---|---|
| *G06F 3/16* | (2006.01) |
| *H03F 3/181* | (2006.01) |
| *H04R 3/12* | (2006.01) |

(52) U.S. Cl.
CPC ............. *G06F 3/165* (2013.01); *H03F 3/181* (2013.01); *H04R 3/12* (2013.01); *H03F 2200/03* (2013.01); *H04R 2499/13* (2013.01)

(58) Field of Classification Search
CPC .... H04R 3/12; H04R 2499/13; H04R 25/356; H04R 25/558; H04R 2225/55; H04R 2227/005; H03F 2200/03; H03F 3/181; G06F 3/165

USPC ... 381/59, 104, 107, 103, 106, 120, 314, 57, 381/74; 330/127

See application file for complete search history.

(56) References Cited

U.S. PATENT DOCUMENTS

| | | | | |
|---|---|---|---|---|
| 10,462,582 | B2 * | 10/2019 | Neumeyer | ........... H04R 25/556 |
| 2005/0078838 | A1 * | 4/2005 | Simon | .................... H03G 5/025 |
| | | | | 381/98 |
| 2007/0097274 | A1 * | 5/2007 | Pfiffer | .............. H04N 21/42222 |
| | | | | 348/734 |
| 2007/0228261 | A1 * | 10/2007 | Kang | ..................... H01H 9/182 |
| | | | | 250/221 |
| 2013/0177186 | A1 * | 7/2013 | Schul | ...................... H02J 50/80 |
| | | | | 381/300 |
| 2013/0223661 | A1 * | 8/2013 | Uzuanis | ............... H04R 1/1041 |
| | | | | 381/314 |
| 2019/0069100 | A1 * | 2/2019 | Andersen | ............... H04R 25/70 |

* cited by examiner

*Primary Examiner* — Norman Yu

(74) *Attorney, Agent, or Firm* — Ferguson Case Orr Paterson LLP

(57) ABSTRACT

The present disclosure is directed to the creation, modification, and selection of a plurality of audio profiles in programmable audio amplifiers. Embodiments of the present disclosure include an input device, a programmable amplifier device, a controller, and an output device. In certain embodiments, the audio amplifier device is pre-programmable and/or re-programmable and can comprise an enclosure, a processor within the enclosure, a receiver communicatively connected to the processor, and a controller external to the enclosure, with the controller being communicatively connected to the processor.

16 Claims, 15 Drawing Sheets

300

320

310

330

3-Pin M12 Sealed Connector

| Pin | Description |
|-----|-------------|
| 1 | Control Signal (LIN) |
| 2 | Power 5v+ [From Amplifier] |
| 3 | Ground |

(Connector Viewed From Front)

AUDIO AMPLIFIER WITH INTEGRATED DIGITAL SIGNAL PROCESSING AND SELECTABLE PROFILES

This application claims the benefit of U.S. Provisional Patent Application Ser. No. 63/190,654, filed on May 19, 2021. The application referred to in this paragraph is incorporated by reference as if set forth fully herein.

BACKGROUND

Field of the Disclosure

The present disclosure relates to audio amplifiers, and, more particularly, to systems, devices, and methods directed to creation, modification, and selection of a plurality of audio profiles in programmable audio amplifiers.

Description of the Related Art

The environment can significantly affect the quality and clarity of audio content. For example, different environments will have different background or ambient noises that interfere with audio quality and clarity. Different environments will also have different materials and placements of audio output devices affecting audio quality and clarity.

In particular, a vehicle presents numerous environmental variables that affect audio quality and clarity. A user in a moving vehicle will have more background and ambient noise interfering with sound volume and quality than a user in a parked or non-moving vehicle. A user in a moving off-road vehicle, such as side-by-side vehicles and all-terrain vehicles, will experience even more noise interference than a user in a standard street vehicle. In off-road vehicles, which continuously experience rougher conditions due to terrain during typical operation and could have louder engines (in contrast to the average street vehicle), it can be particularly difficult to achieve optimal sound volume and quality.

Many users will try to manually adjust the audio settings in their vehicle to optimize sound output for different environments. This is time consuming, cumbersome, and often fails to in fact achieve optimal sound output as users do not know how or what to adjust audio settings for different environments. Thus, there is a need in the market for audio amplifiers that can accommodate a number of selectable audio profiles to provide an optimal listening experience in various environments in a given vehicle.

SUMMARY OF THE DISCLOSURE

Described herein are various embodiments of a programmable audio system, a programmable amplifier device, and a method of providing users with a plurality of pre-programmed audio profiles.

These and other further features and advantages of the disclosure would be apparent to those skilled in the art from the following detailed description of the disclosure and accompanying drawings which set forth illustrative embodiments in which the principles of the disclosures are utilized.

Figure 1:
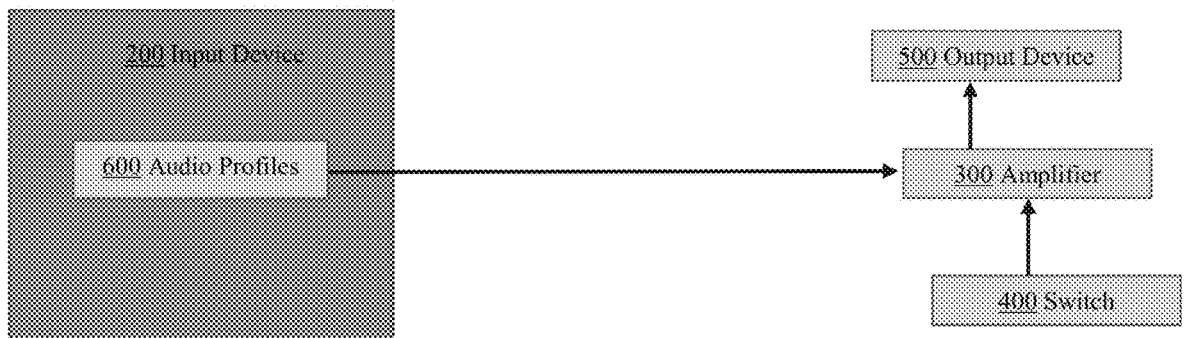
FIG. 1 is a diagram of a programmable audio system according to one embodiment of the present disclosure.

The drawings are for the purpose of illustrating various exemplary embodiments. It is understood that the disclosure is not limited to the arrangements and depictions shown in the drawings.

DETAILED DESCRIPTION OF THE DISCLOSURE

The present disclosure will now set forth detailed descriptions of various embodiments. Described herein are systems, devices, and methods directed to creation, modification, and selection of a plurality of audio profiles in programmable audio amplifiers.

Throughout this description, the embodiments and examples illustrated should be considered as exemplars, rather than as limitations on the present disclosure. As used herein, the term "disclosure," "device," "present disclosure," or "present device" refers to any one of the embodiments of the disclosure described herein, and any equivalents. Furthermore, reference to various feature(s) of the "disclosure," "device," "present disclosure," or "present device" throughout this document does not mean that all claimed embodiments or methods must include the referenced feature(s).

It is also understood that when an element or feature is referred to as being "on" or "adjacent" to another element or feature, it can be directly on or adjacent the other element or feature or intervening elements or features may also be present. It is also understood that when an element is referred to as being "attached," "connected" or "coupled" to another element, it can be directly attached, connected or coupled to the other element or intervening elements may be present. In contrast, when an element is referred to as being "directly attached," "directly connected" or "directly coupled" to another element, there are no intervening elements present.

Relative terms, such as "outer," "above," "lower," "below," "horizontal," "vertical" and similar terms, may be used herein to describe a relationship of one feature to another. It is understood that these terms are intended to encompass different orientations in addition to the orientation depicted in the figures.

Although the terms first, second, etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure. As used herein, the term "and/or" includes any and all combinations of one or more of the associated list items.

The terminology used herein is for describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," when used herein, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to different views and illustrations that are schematic illustrations of idealized embodiments of the disclosure. As such, variations from the shapes of the illustrations as a result, for example, of manufacturing techniques and/or tolerances are expected. Embodiments of the disclosure should not be construed as limited to the particular shapes of the regions illustrated herein, but are to include deviations in shapes that result, for example, from manufacturing.

As shown in FIG. 1, one embodiment of a programmable audio system 100 comprises an input device 200, a programmable audio amplifier device 300, a controller or switch 400, and an output device 500.

The input device 200 may comprise a tablet, computer, or some other device with an operating system and the capability to load and use software used to create, modify, and/or adjust audio profiles 600. The audio profiles 600 can be created, modified, and/or adjusted based any number of environmental variables to provide a profile this optimal in a given environment. Some examples of these environmental variables include: make and model of vehicle, movement, vehicle geometry, engine noise, quantity of output devices, output device staging, and/or audio source unit. Many other variables may also affect the listening experience of a user, and each of those variables may be considered in creating the desired audio profile(s) 600. Moreover, as discussed in detail below, in some embodiments the controller or switch 400 configured to allow a user to select from a plurality of pre-programmed audio profiles 600 may be physically connected to the audio amplifier device 300 or wirelessly connected to the amplifier 300.

Figure 2:
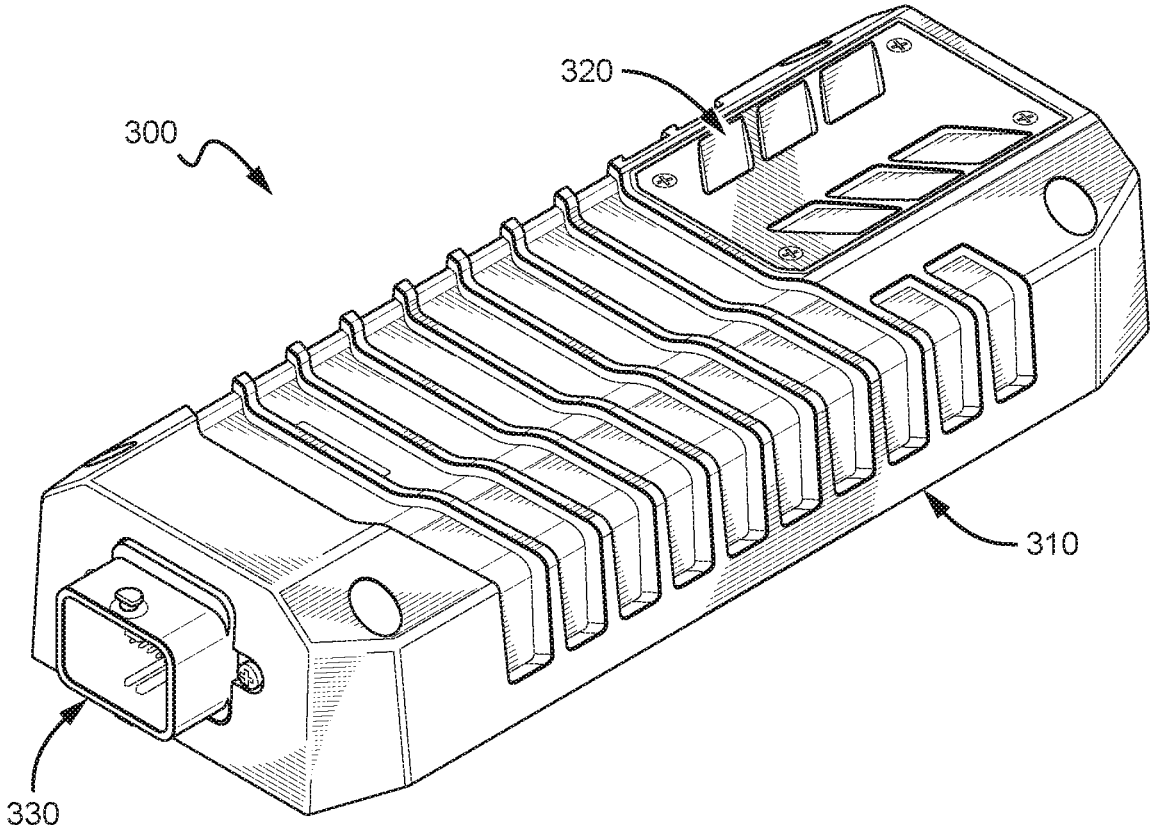
FIG. 2 is a top perspective view of the programmable audio amplifier device according to one embodiment of the present disclosure.
Figure 3A:
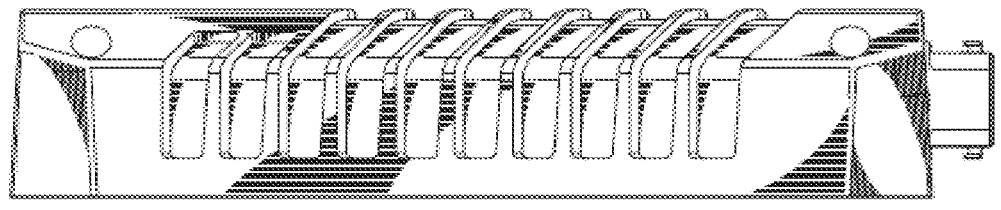
FIG. 3A is left side elevation view of the programmable audio amplifier device according to the embodiment of the present disclosure as shown in FIG. 2.
Figure 3B:
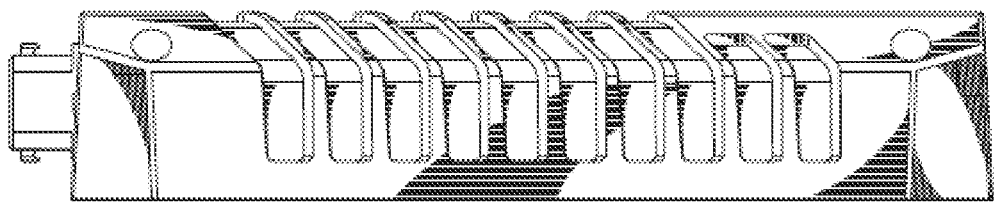
FIG. 3B is a right side elevation view of the programmable audio amplifier device according to the embodiment of the present disclosure as shown in FIG. 2.
Figure 3C:
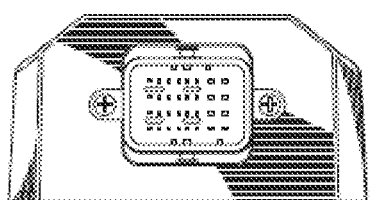
FIG. 3C is a front side elevation view of the programmable audio amplifier device according to the embodiment of the present disclosure as shown in FIG. 2.
Figure 3D:
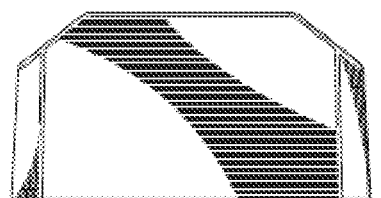
FIG. 3D is a back side elevation view of the programmable audio amplifier device according to the embodiment of the present disclosure as shown in FIG. 2.
Figure 4:
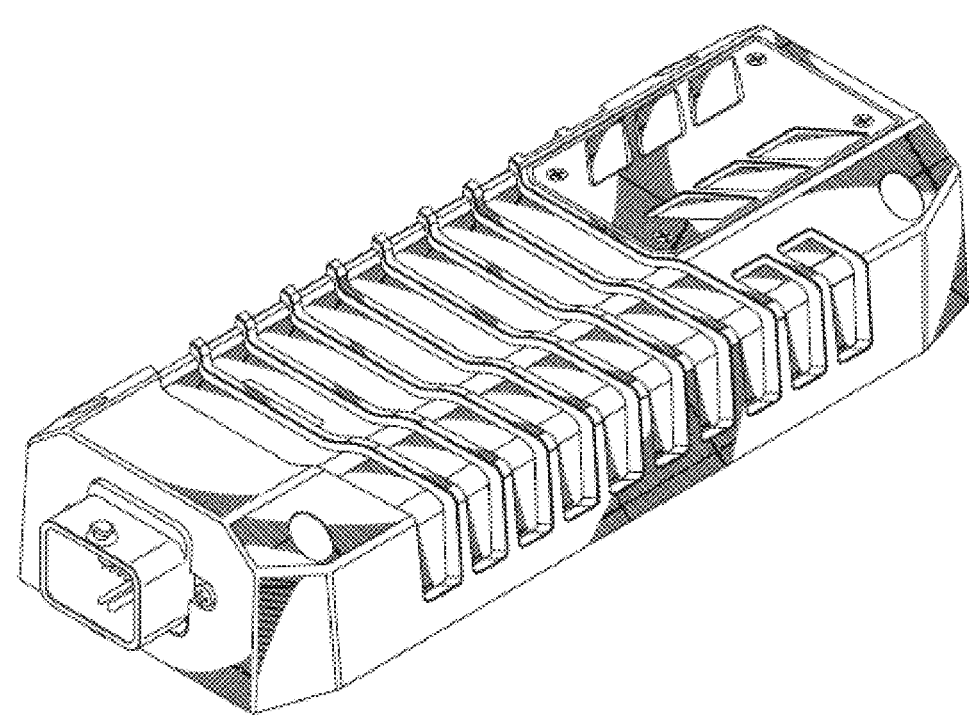
FIG. 4 is a top perspective of the programmable audio amplifier device according to the embodiment of the present disclosure as shown in FIG. 2.
Figure 5A:
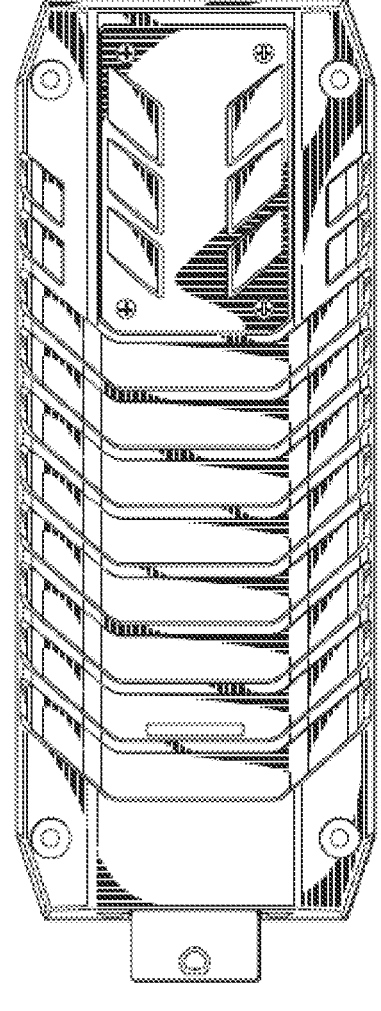
FIG. 5A is a top plan view of the programmable audio amplifier device according to the embodiment of the present disclosure as shown in FIG. 2.
Figure 5B:
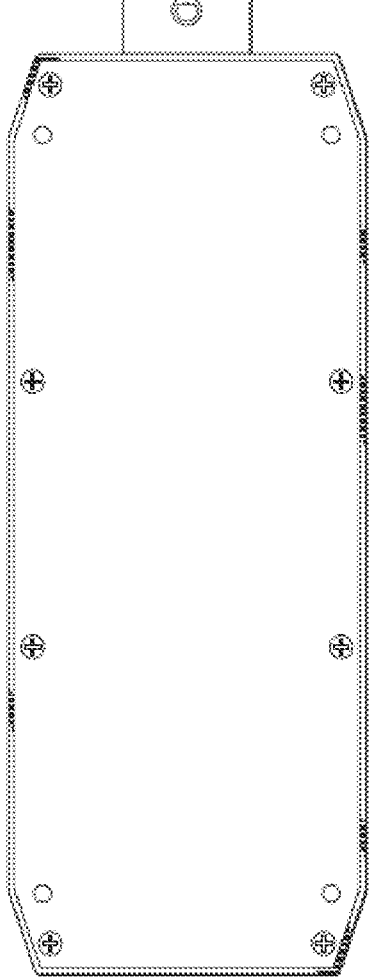
FIG. 5B is a bottom plan view of the programmable audio amplifier device according to the embodiment of the present disclosure as shown in FIG. 2.
Figure 9:
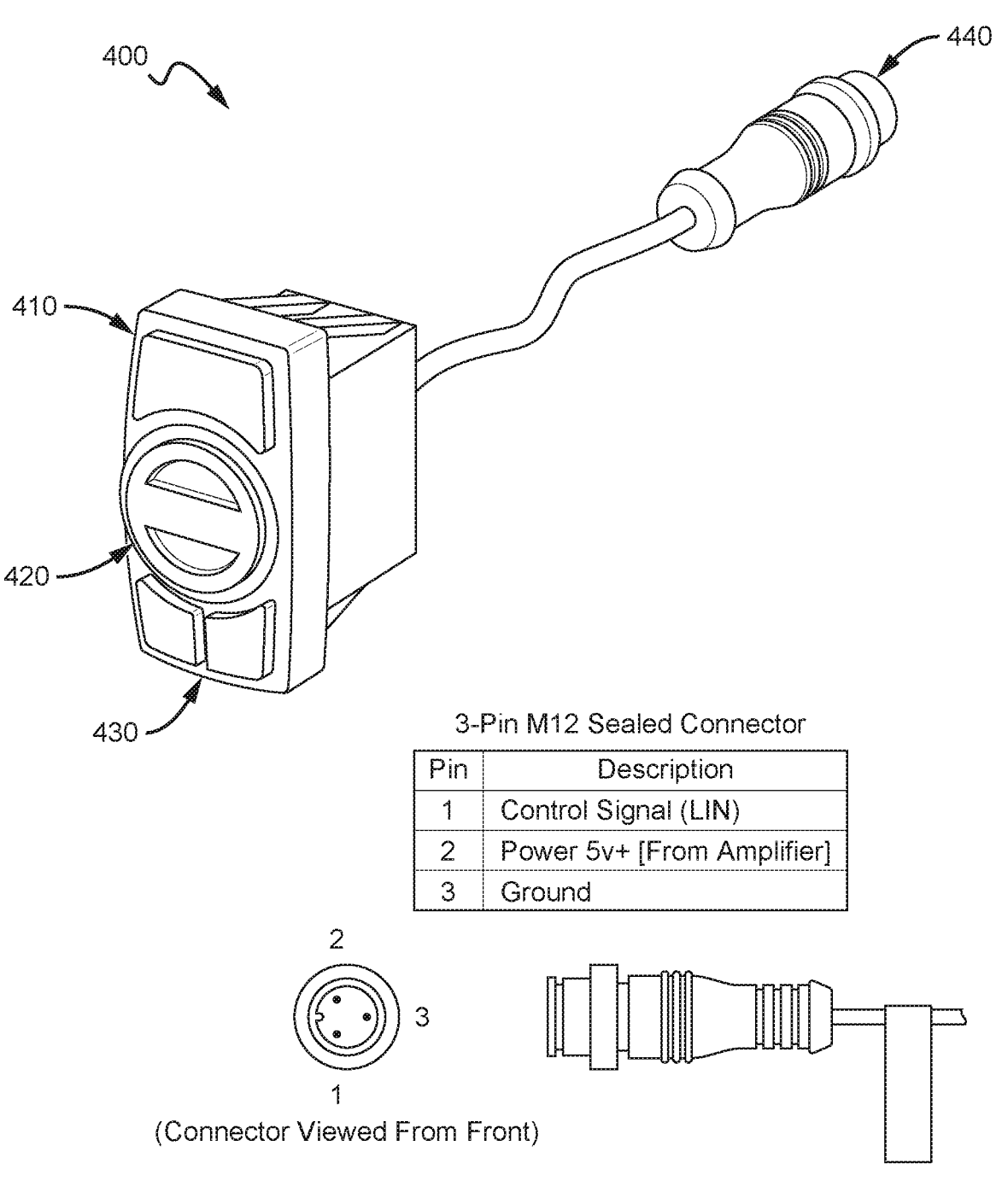
FIG. 9 is perspective view of a controller according to one embodiment of the present disclosure.
Figure 10:
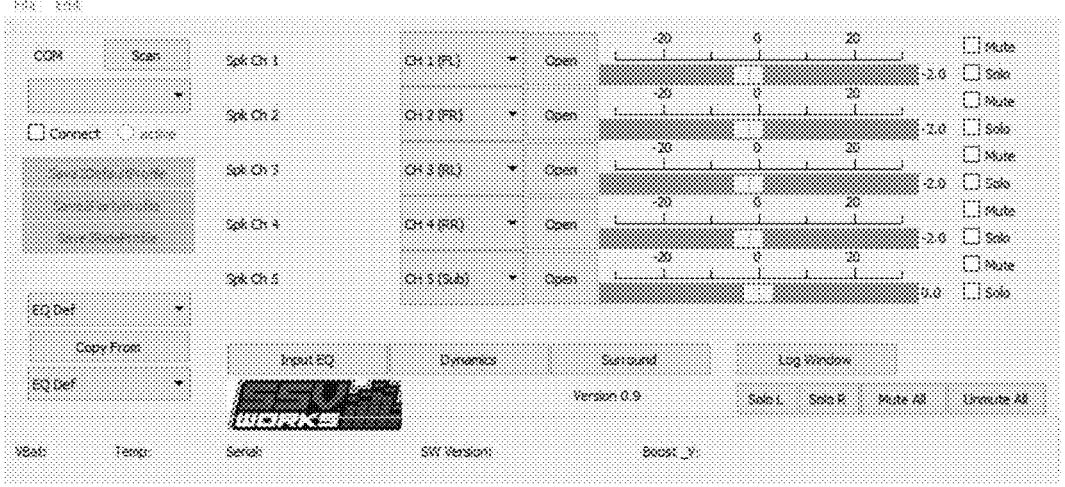
FIGS. 10-17 are graphic representations of the software user interference showing example audio profiles according to one embodiment of the present disclosure.
Figure 11:
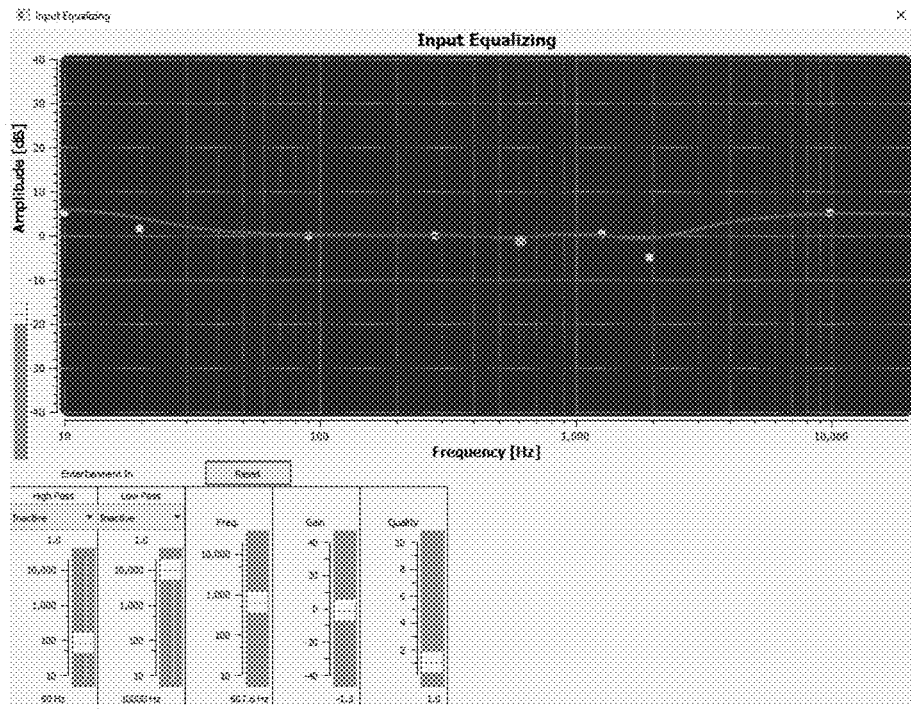

FIGS. 2-5 show one embodiment of an audio amplifier device 300 disclosed herein. In this embodiment of the present disclosure, the audio amplifier device 300 is capable of storing at least one pre-programmed audio profile 600. The audio amplifier device 300 is pre-programmable and/or re-programmable. FIG. 2 shows an embodiment of a programmable audio amplifier device 300 incorporating features of the present disclosure. The programmable amplifier device 300 can comprise an enclosure 310; a processor within the enclosure 310; a receiver communicatively connected to the processor; and a switch external to the enclosure 400 (not pictured in FIG. 2; an example according to one embodiment is shown in FIG. 9), with the switch being communicatively connected to the processor.

The enclosure 310 of the programmable amplifier device 300 can be formed by any suitable method, for example, molding, injection molding, stamping/pressing, three-dimensional printing, extrusion and/or any methods known in the art of sound equipment manufacturing. The enclosure 310 can be formed from multiple component parts, or one or more portions of the body can be formed together a single part.

In one embodiment of the present disclosure, the enclosure 310 of the programmable amplifier device 300 can comprise cast aluminum or another suitable or similar material able to protect the interior from water, sand, and other abrasive or destructive elements.

The enclosure 310 can have a sealed plate 320 on one side that allows for access to a control panel 322 (shown in FIGS. 6 and 7) that allows for adjustment of some of the amplifier operating parameters. The plate 320 may be made of the same material as the enclosure 310 or some other suitable or similar material able to protect the interior from water, sand, and other abrasive or destructive elements. The plate 320 may be fastened to the enclosure 310 by screws, glue, or other methods and/or materials that ensures sealing.

Figure 6:
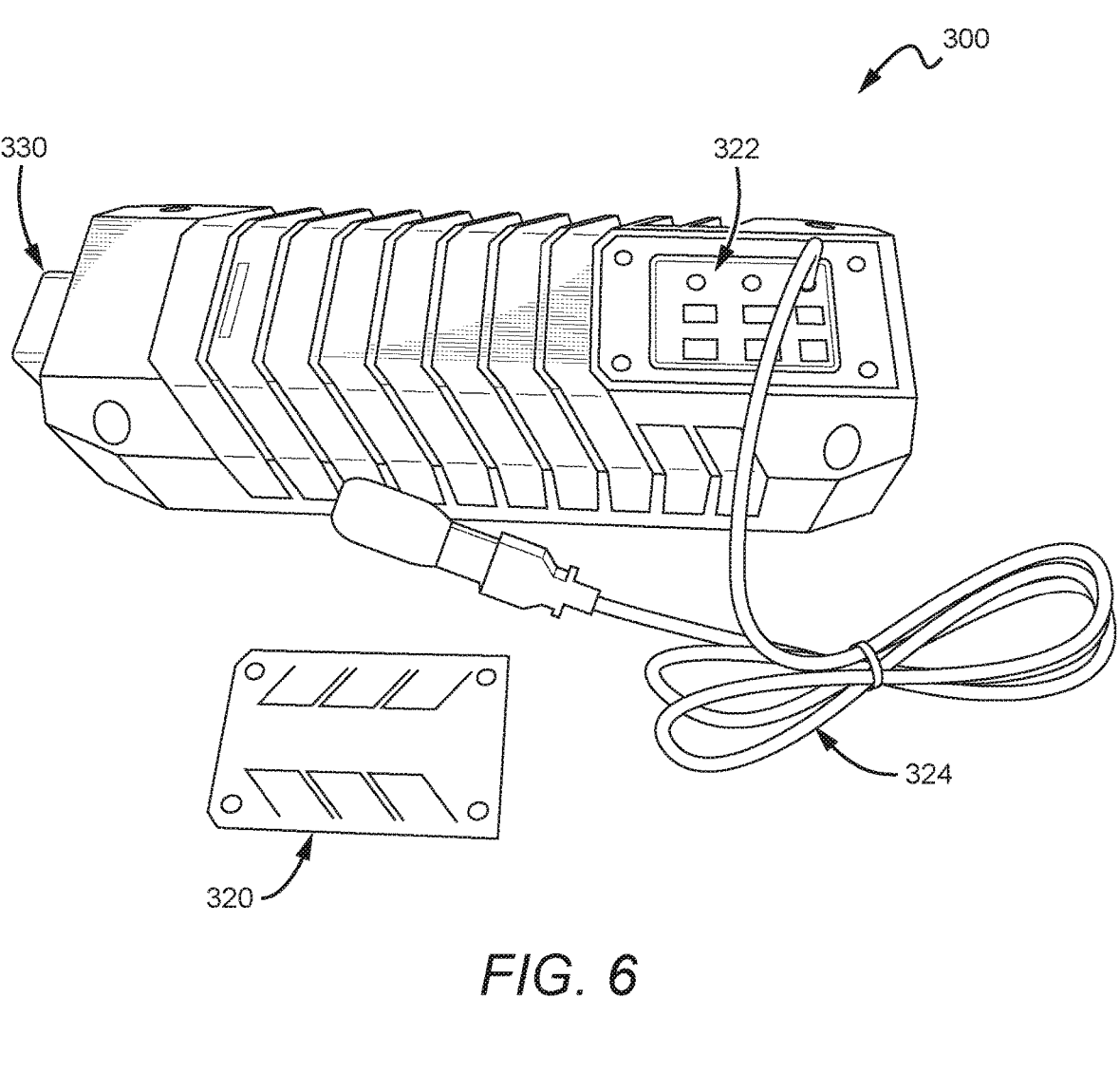
FIG. 6 is a perspective view of the programmable audio amplifier device with the sealed plate removed according to one embodiment of the present disclosure as shown in FIG. 2.
Figure 7:
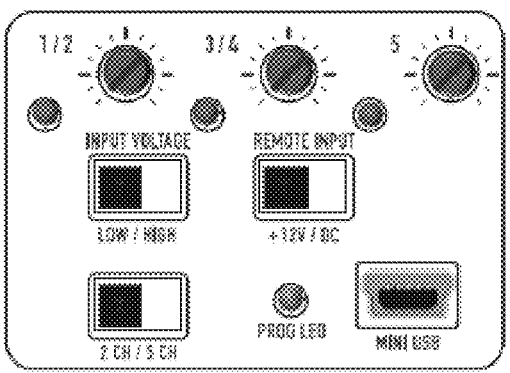
FIG. 7 is a graphical view of a control panel of a programmable audio amplifier device according to one embodiment of the present disclosure as shown in FIG. 2.

Various data input receivers, switches, and/or dials to adjust various parameters and/or to download or receive the plurality of pre-programmed audio profiles 600 can be found in the control panel 322 underneath the sealed plate 320 of the enclosure 310. FIG. 6 depicts an example of one embodiment of data input receivers on the control panel 322 underneath the sealed plate 320. FIG. 7 depicts a graphical view of a control panel of a programmable audio amplifier device according to one embodiment of the present disclosure. The control panel 322 may comprise data input receivers, switches, and/or dials that are communicatively connected to the amplifier device 300 to allow it to download or receive the plurality of pre-programmed audio profiles 600 or for the adjustment of parameters using switches, dials, or other selection means. The communicative connection between the amplifier device 300 and the control panel 322 underneath the sealed plate 320 can be established through a wired connection to an input device 200 such as universal serial bus (USB) connection to a computer or tablet or a wireless connection such as a Bluetooth connection to an input device 200.

As shown in FIG. 6, in one embodiment, a USB flash drive may connect to the amplifier 300 via a USB input 324 connected to the control panel 322 underneath the sealed plate 320 of the enclosure 310. In some embodiments, the programmable amplifier 300 is configured to auto-download audio profiles 600 from a USB flash drive or another input device, for example, when the USB flash drive is plugged into the amplifier 300. In embodiments where the audio profiles 600 are downloaded onto the amplifier 300 wirelessly, the download process can be initiated automatically when the wireless input device is brought into proximity with the amplifier 300. In both wired and wireless configurations, the download process can be initiated manually.

The processor of the programmable amplifier device 300 can be configured to store a plurality of selectable audio profiles 600. The processor of the programmable amplifier device 300 can also be configured to make dynamic adjustments of audio profiles 600 using live data about certain parameters. In one embodiment, this data may come from a vehicle controller area network (CAN). For example, the audio amplifier device 300 may be programmed to dynamically and automatically adjust the output signal if, for example, the vehicle's speed changes, the ambient sound changes (e.g., if the windows are rolled down), or if the type of music being played changes. Many different types of data may be used by the audio amplifier device 300 to select or adjust an audio profile for optimal listening.

As shown in FIGS. 2-6, an input/output connector 330 is attached and/or integrated onto one side of the enclosure of the programmable amplifier device 300. The input/output connector 330 may be used to connect to the output device 500 and/or switch 400 to allow selection between the plurality of pre-programmed audio profiles 600.

Figure 8:
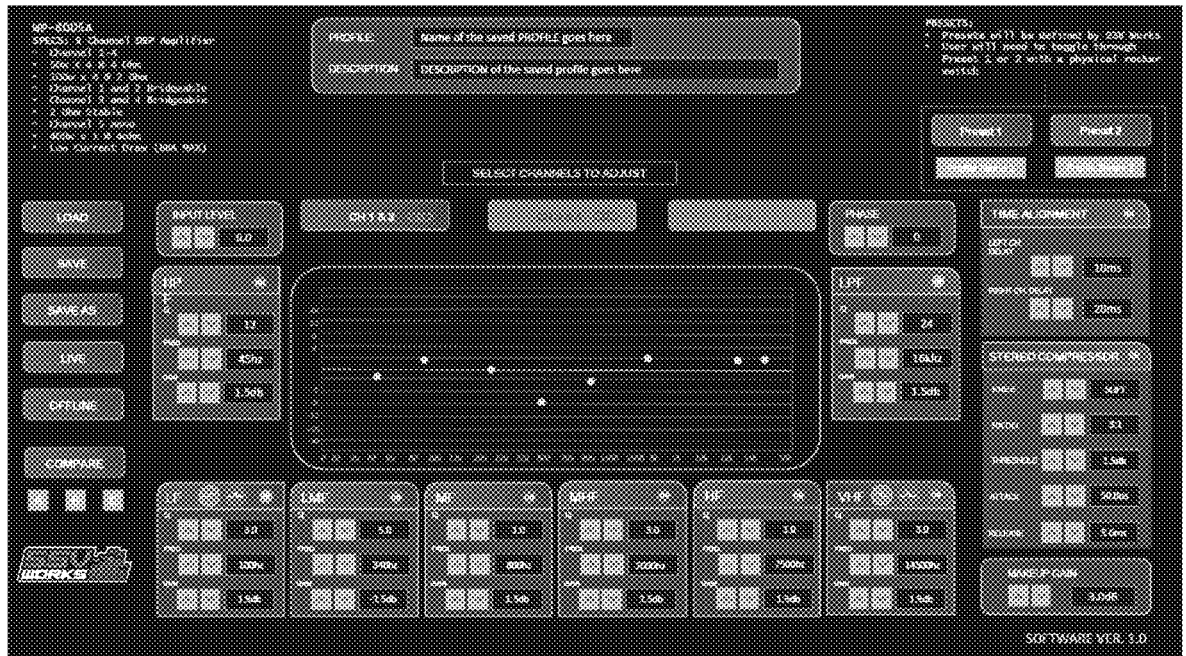
FIG. 8 is a graphic representation of a software user interface used to create, modify, or adjust the audio profiles on an input device according to one embodiment of the present disclosure.

FIG. 8 is one embodiment of an input device 200 user interface showing a graphic representation of software that can be used to create, modify, or adjust the audio profiles 600. The audio profiles 600 may be programmed using a software application to adjust parameters such as the high and low pass crossover, frequency, gain, quality, compression, delay compensation in each of a multitude of channel outputs. It is understood that other parameters may be included and/or adjusted using the input device 200 and the programming software application. In some embodiments, the audio amplifier device 300 processor can accommodate a minimum of five channels.

FIG. 9 shows one embodiment of the controller or switch 400 external to the enclosure and incorporating some features of the present disclosure. The pictured switch 400 allows the user to easily and quickly select one of a plurality of pre-programmed audio profiles 600 loaded onto the amplifier 300. In one embodiment, the switch 400 is located on a vehicle dashboard. The user does not need to go into any settings to adjust audio settings or choose a profile, as the audio profiles 600 are available via one-push buttons 410, 420 on the switch 400. The switch 400 is communicatively connected to the amplifier device 300 through a connector 440. The switch 400 comprises buttons 410, 420 with pre-programmed audio profile names or descriptions, such as "Rock" on the button 410 and "Ride" on the button 420, as shown in FIG. 9. It is understood that the switch can comprise more buttons with different positioning. It is further understood that the audio profile names can vary in different embodiments of the present disclosure. In some embodiments, such as the one shown in FIG. 9, the switch 400 may also compromise buttons to adjust the subwoofer, if any, in the selected audio profile 430. In some embodiments, the buttons may be programmed to correspond with a particular profile as shown in FIG. 9. While in other embodiments, a button may be programmed to cycle through any number of audio profiles. Other selection schemes are also possible. Furthermore, in other embodiments, instead of the switch 400 shown in FIG. 9, the amplifier 300 may communicate via a CAN, allowing for control of its outputs (e.g., volume, tune, etc.) and/or profiles from a CAN-enabled device, like a touchscreen in the dash of a vehicle.

Figure 12:
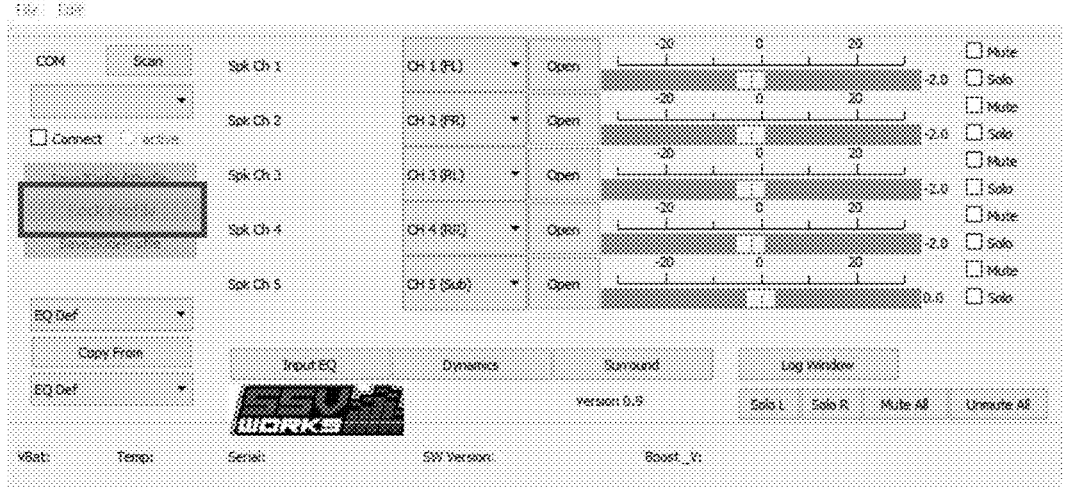
Figure 13:
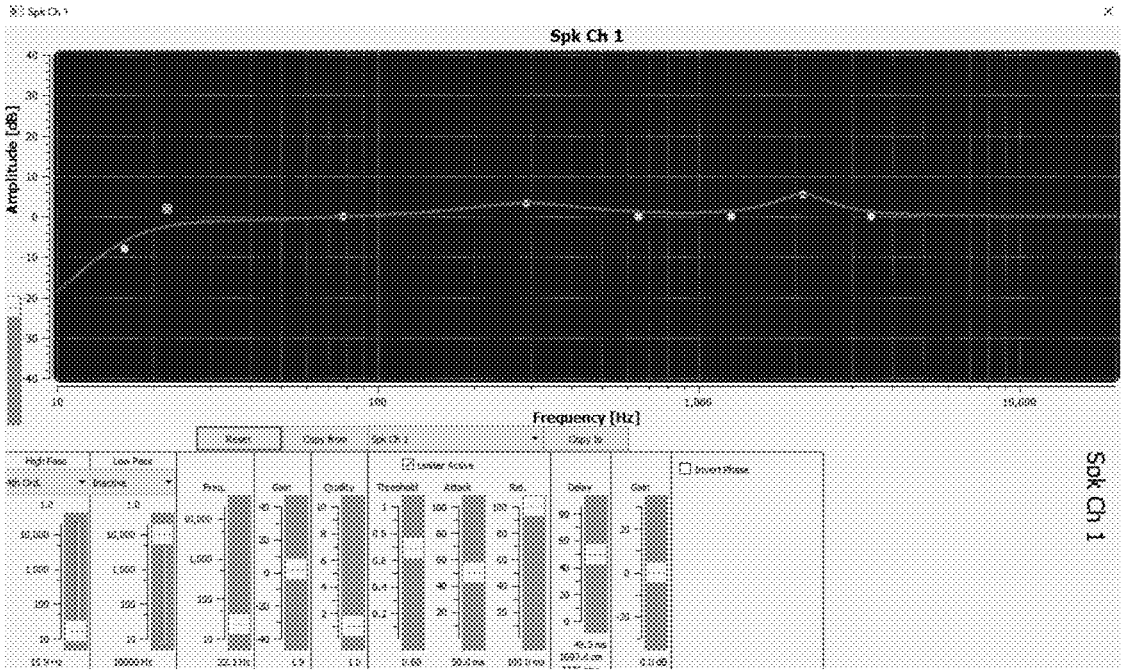
Figure 14:
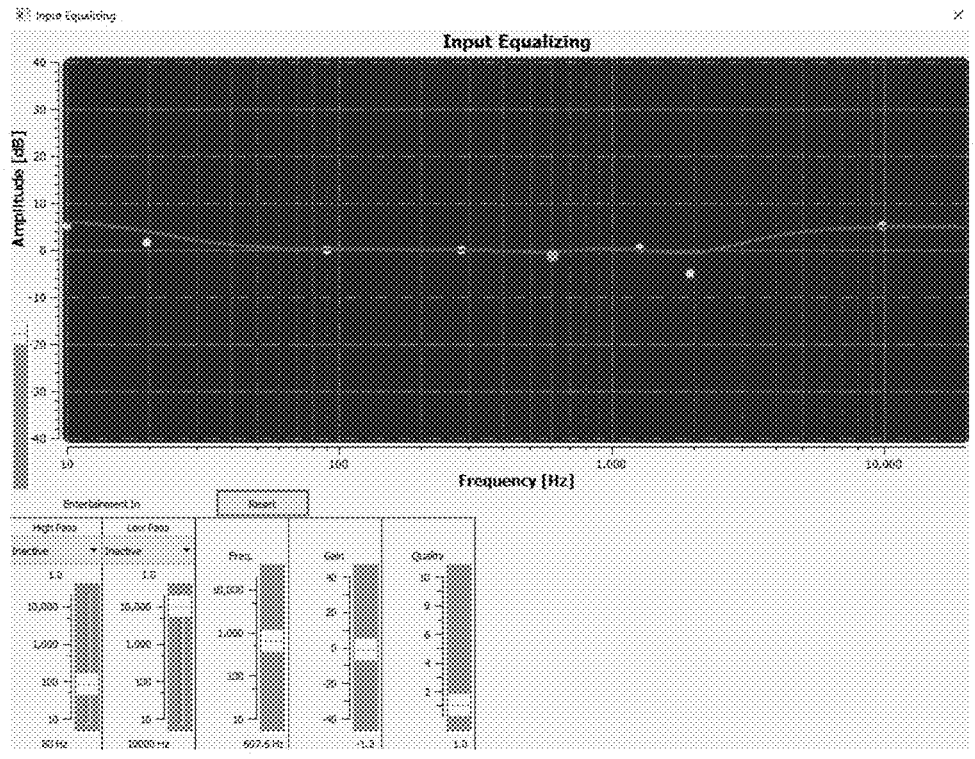

FIGS. 10-17 are graphic representations of the software user interface showing exemplary audio profiles according to one embodiment of the present disclosure. In FIGS. 12-14, the graphic representations of the software user interface shown depicts an example of a "rock" audio profile. The "rock" profile optimizes audio content for output devices in or on vehicles and for when that vehicle is not in motion. The "rock" profile causes the output device to output the fullest sound possible by considering the vehicles media source unit, speaker enclosures, and speaker placement.

Figure 15:
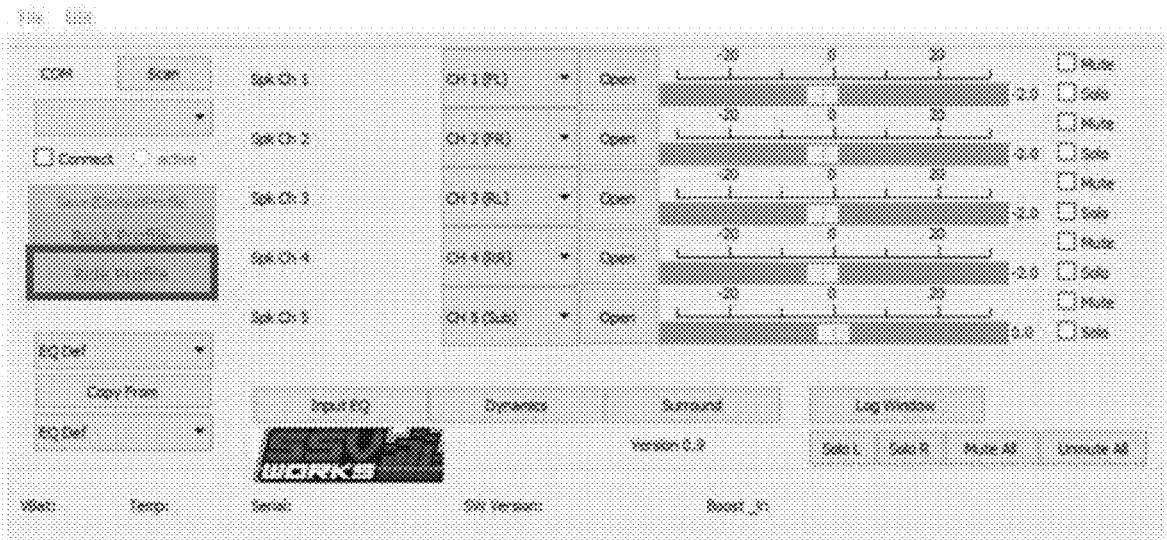
Figure 16:
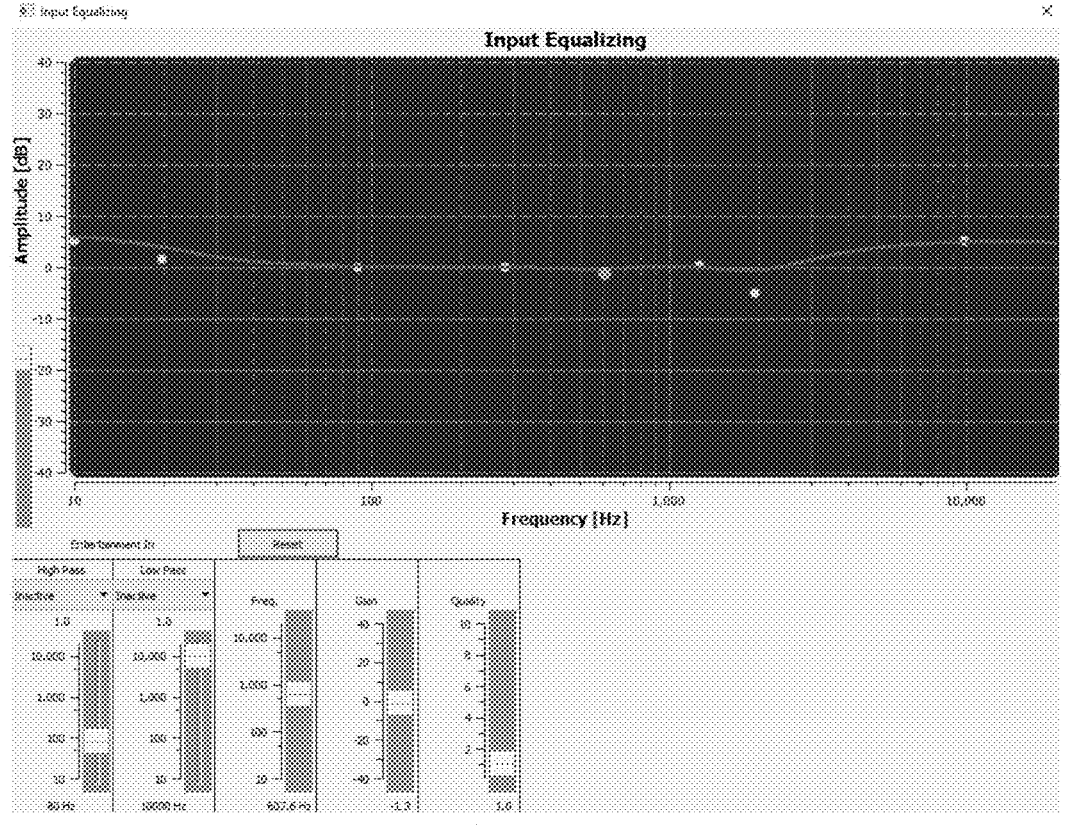
Figure 17:
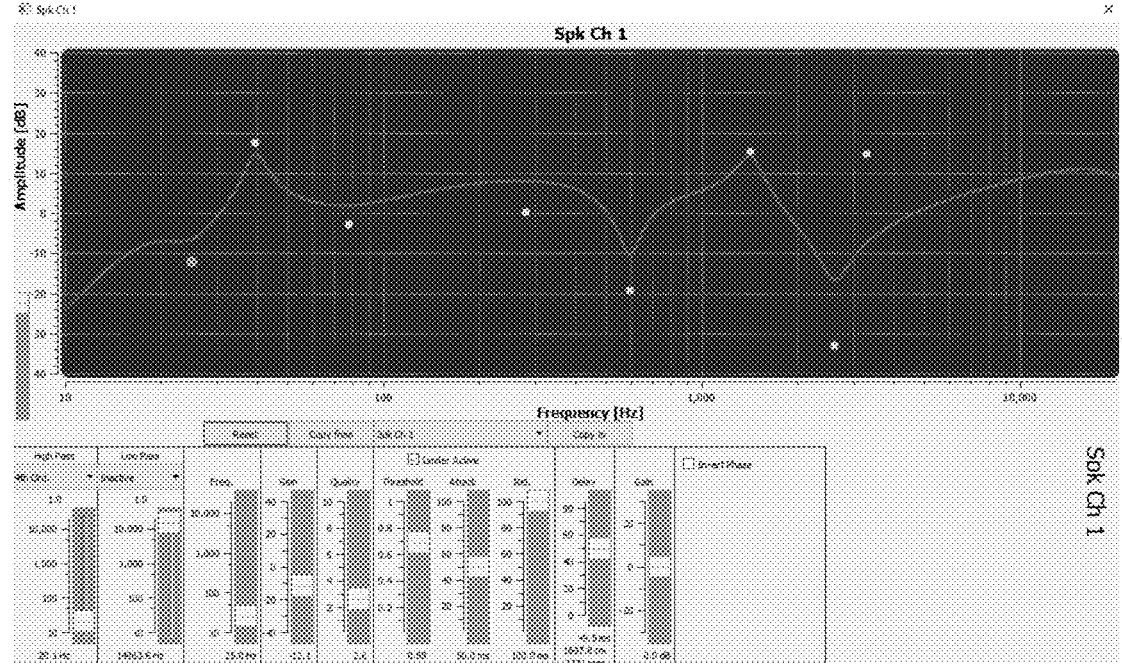

In FIGS. 15-17, the graphic representations of the software user interface shown depict an example of a "ride" profile. In one embodiment, the "ride" profile optimizes the listening experience for output devices in a moving vehicle. The "ride" profile also compensates for wind and engine noise to achieve the best possible sound while the vehicle is in motion.

In some embodiments, the output device 500 comprises speakers that are communicatively connected to the amplifier device 300. The user selects a pre-programmed audio profile 600 using the switch 400, which communicates that selection to the amplifier 300, which in turn applies the settings associated with the selected audio profile 600 to the audio content to create an adjusted output signal that is then transmitted from the amplifier device 300 to at least one output device 500, such as a set of speakers. It is understood that output devices can comprise other devices such as headphones.

Figure 18:
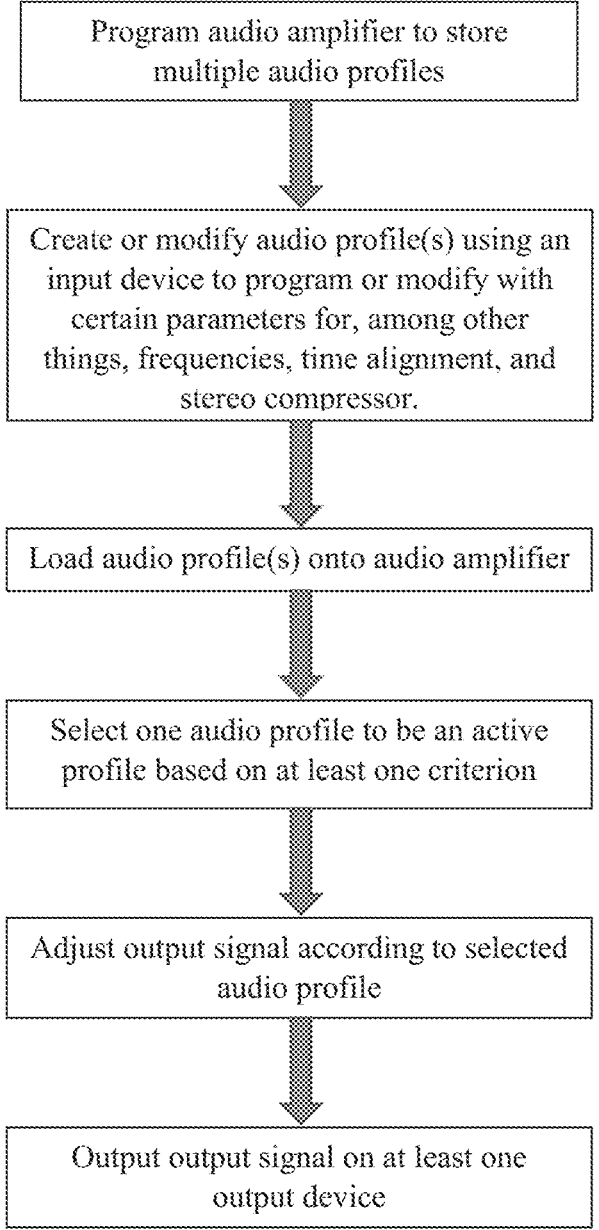
FIG. 18 is an overview flow diagram of a method of providing users with a plurality of pre-programmed audio profiles, according to one embodiment of the present disclosure.

FIG. 18 is an exemplary flowchart showing an embodiment of a method of providing a user with a plurality of pre-programmed audio profiles. In step 710, an audio amplifier processor is programmed to store multiple audio profiles 600. Then, in step 720, a plurality of audio profile(s) 600 are created or modified using an input device 200 to program or modify with certain parameters for, among other things, frequencies, time alignment, and stereo compressor. In step 720, the pre-programmed audio profiles 600 are downloaded onto the audio amplifier processor. In step 740, a pre-programmed audio profile 600 is selected to be an active profile based on at least one criterion (e.g., user preference, environmental characteristics, or musical genre, etc.). As discussed herein, the selection can be manual or automatic. In either case, the selection can be based on a single criterion or on multiple criteria. In step 750, the audio amplifier device 300 adjusts the output signal according to the selected audio profile 600. In step 760, the amplifier device 300 outputs the output signal created by the audio amplifier device to at least one output device.

Although the present disclosure has been described in detail with reference to certain configurations thereof, other versions are possible. Embodiments of the present disclosure can comprise any combination of compatible features shown in the various figures, and these embodiments should not be limited to those expressly illustrated and discussed. Therefore, the spirit and scope of the disclosure should not be limited to the versions described above.

The foregoing is intended to cover all modifications and alternative constructions falling within the spirit and scope of the disclosure as expressed in the claims, wherein no portion of the disclosure is intended, expressly or implicitly, to be dedicated to the public domain if not set forth in any claims.

We claim:

1. A programmable audio system comprising:
    a programmable audio amplifier device configured to store a plurality of audio profiles, wherein each of said audio profiles comprises a stored set of audio parameters including at least one crossover parameter and at least one delay parameter defining relative timing, each associated with at least one output channel;
    an input device to program or modify said plurality of audio profiles, wherein said input device is configured to communicate with said programmable audio amplifier device and wherein said input device is separate from said programmable audio amplifier device;
    a controller communicatively connected to said audio amplifier, said controller allowing selection of one of said plurality of audio profiles and wherein said controller is separate from said programmable audio amplifier device; and
    at least one output device communicatively connected to said audio amplifier.

2. A programmable audio amplifier device comprising:
    an enclosure, wherein said enclosure comprises a control panel, said control panel comprising a plurality of mechanisms to adjust the operating parameters of said programmable audio amplifier device and said control panel also comprising a receiver configured to receive a plurality of audio profiles;
    a processor within said enclosure, said processor configured to store said plurality of audio profiles; and
    a controller external to said enclosure and separate from said enclosure, said controller in communicative connection with said processor
    to allow for selection of one of said plurality of selectable audio profiles,
    wherein each of said audio profiles comprises a stored set of audio parameters including at least one crossover parameter and at least one delay parameter defining relative timing, each associated with at least one output channel.

3. The programmable audio amplifier device of claim 2, wherein said controller is configured to also allow for adjustment of audio volume, subwoofer volume, or tuning.

4. A method of providing a plurality of pre-programmed audio profiles comprising steps of;
    creating or modifying a plurality of selectable audio profiles using an input device that is separate from an audio amplifier device, wherein each of said selectable audio profiles comprises a stored set of audio processing parameters including at least one crossover parameter and at least one delay compensation parameter, each associated with at least one output channel;
    programming an audio amplifier device to store said plurality of selectable audio profiles;
    loading said plurality of selectable audio profiles onto said audio amplifier device;
    selecting one of said plurality of audio profiles loaded onto said audio amplifier device to be an active audio profile based on at least one selection criterion;
    adjusting an output signal according to said active audio profile; and
    outputting said output signal to at least one output device.

5. The programmable audio system of claim 1, wherein said input device comprises a device with an operating system capable of loading and using software to create, modify, or adjust said audio profiles.

6. The programmable audio system of claim 1, wherein said controller is physically wired to said audio amplifier.

7. The programmable audio system of claim 1, wherein said controller is wirelessly connected to said audio amplifier.

8. The programmable audio amplifier device of claim 2, wherein said processor is pre-programmable.

9. The programmable audio amplifier device of claim 2, wherein said processor is re-programmable.

10. The programmable audio amplifier device of claim 2 wherein one of said plurality of mechanisms of said control panel is said receiver.

11. The programmable audio amplifier device of claim 2 wherein one of said plurality of mechanisms of said control panel is a switch.

12. The programmable audio amplifier device of claim 2 wherein one of said plurality of mechanisms of said control panel is a dial.

13. The programmable audio amplifier device of claim 2 wherein said receiver is communicatively connected to said processor through a wired connection.

14. The programmable audio amplifier device of claim 2 wherein said receiver is communicatively connected to said processor through a wireless connection.

15. The programmable audio amplifier device of claim 2 wherein said processor is configured to make dynamic adjustments to said audio profiles.

16. The programmable audio amplifier device of claim 2 wherein said controller is configured with buttons to switch between said audio profiles.

* * * * *